United States Patent
Witherbee et al.

(10) Patent No.: US 7,142,412 B2
(45) Date of Patent: Nov. 28, 2006

(54) BYPASS CONNECTOR FOR A SOCKET ASSEMBLY

(75) Inventors: Martin L. Witherbee, Godfrey, IL (US); Brad A. Criner, Coffeen, IL (US); Dallas Wayne Kellerman, Belleville, IL (US)

(73) Assignee: Cooper Technologies Company, Houston, TX (US)

( * ) Notice: Subject to any disclaimer, the term of this patent is extended or adjusted under 35 U.S.C. 154(b) by 257 days.

(21) Appl. No.: 10/872,684

(22) Filed: Jun. 21, 2004

(65) Prior Publication Data

US 2005/0280980 A1 Dec. 22, 2005

(51) Int. Cl.
*H02B 1/00* (2006.01)
*H01R 33/945* (2006.01)
*H01R 4/36* (2006.01)

(52) U.S. Cl. .................. 361/662; 439/517; 439/811; 439/814; 439/957

(58) Field of Classification Search ............... 361/662; 439/517, 810–815, 907, 957
See application file for complete search history.

(56) References Cited

U.S. PATENT DOCUMENTS

| | | | | |
|---|---|---|---|---|
| 3,050,706 | A | * | 8/1962 | Hector ..................... 439/781 |
| 3,195,099 | A | * | 7/1965 | Sloop ....................... 439/488 |
| 3,742,431 | A | * | 6/1973 | Kobryner .................. 439/814 |
| 3,876,279 | A | * | 4/1975 | Underwood ............... 439/797 |
| 4,053,202 | A | | 10/1977 | Norden |
| 4,117,530 | A | | 9/1978 | Reed et al. |
| 4,199,216 | A | * | 4/1980 | Gryctko ..................... 439/814 |
| 4,369,484 | A | | 1/1983 | Fugate et al. |
| 4,427,258 | A | | 1/1984 | Mueller |
| 5,005,104 | A | | 4/1991 | Grunert et al. |
| 5,030,131 | A | | 7/1991 | Boehm |
| 5,107,396 | A | | 4/1992 | Rosen et al. |
| 5,206,789 | A | | 4/1993 | Barbry |
| 5,269,710 | A | | 12/1993 | Donnerstag |
| 5,533,913 | A | | 7/1996 | Boehm et al. |
| 5,657,200 | A | | 8/1997 | Leach et al. |
| 5,853,300 | A | | 12/1998 | Robinson et al. |
| 5,957,733 | A | | 9/1999 | Mello et al. |
| 6,437,268 | B1 | | 8/2002 | Etscheidt et al. |
| 6,529,112 | B1 | | 3/2003 | Leone |
| 6,561,844 | B1 | | 5/2003 | Johnson |
| 6,565,394 | B1 | * | 5/2003 | Seff et al. ................... 439/807 |
| 2005/0207097 | A1 | * | 9/2005 | Neace ........................ 361/627 |

OTHER PUBLICATIONS

Photograph of Milbank Meter Socket comprising a Milbank Bypass Lug, not dated, 1 page.

(Continued)

*Primary Examiner*—Lynn Feild
*Assistant Examiner*—Robert J. Hoffberg
(74) *Attorney, Agent, or Firm*—Senniger Powers

(57) ABSTRACT

A socket assembly for mounting an electric meter comprising a plurality of power line connector subassemblies for connecting electric power lines to the socket assembly. Each subassembly comprises a generally U-shaped lug of electrically conductive material defining a saddle for supporting one of the electric power lines, a connector and a screw. The connector comprises a body of electrically conductive material having opposite sides slidably engageable with respective legs of the lug. A horn of electrically conductive material projects from the body for connection to a bypass conductor forming at least part of an electrical path for bypassing the electric meter. The screw is threadable through a screw opening in the connector to a position in which the screw is adapted to contact said power line in the saddle of the lug.

20 Claims, 10 Drawing Sheets

OTHER PUBLICATIONS

Photograph of Durham Bypass Connector removed from Durham J-Style Lug, not dated, 1 page (reference 21 is a photograph of Durham Bypass Connector received in Durham J-Style Lug).

Photograph of Durham Bypass Connector received in Durham J-Style Lug, not dated, 1 page.

Photograph of T&B Meter Socket comprising a T&B J-Style Lug, not dated, 1 page.

* cited by examiner

BYPASS CONNECTOR FOR A SOCKET ASSEMBLY

BACKGROUND OF THE INVENTION

This invention relates generally to electric meters for monitoring the consumption of electricity, and more particularly to components used in a meter box to provide an electrical path which bypasses the meter.

A meter box typically houses a socket assembly and an electric meter which plugs into the socket assembly. A conventional socket assembly includes a base and a number of connector subassemblies mounted on the base for connection of the incoming power supply lines and outgoing power load lines. A first version of a connector subassembly includes a U-shaped lug, a nut-type connector having a sliding connection with the lug, and a screw threaded through an opening in the nut-type connector into pressure contact with a power conductor positioned in the lug. A second version of the subassembly is identical to the first except that the lug is equipped with a component (e.g., a tang-like member or "horn") which can be used to bypass the meter, as during meter repair or replacement, to avoid interruption of power to the installation (e.g., residence) being serviced. Because the lugs are not readily removable in the field, manufacturers typically stock two types of meter socket assemblies, one with lugs having the bypass component and one with lugs without the bypass component. This arrangement is not particularly economical and may cause delays or problems in the field if the desired configuration is not available.

There is a need, therefore, for a meter socket assembly with an improved meter bypass system.

SUMMARY OF THE INVENTION

Among the several objects of this invention may be noted the provision of meter socket assembly having an improved meter bypass system; the provision of such a socket assembly which can be manufactured with lugs of a single standard configuration, regardless of whether the socket assembly has a bypass system, thereby reducing the number of socket configurations which need to be stocked; the provision of such a socket assembly which can be readily configured in the field and/or at the factory to include or eliminate the bypass system; the provision of such a socket assembly which can be quickly and easily converted between an assembly with the bypass feature and an assembly without the bypass feature; and the provision of a meter socket assembly system which includes a standard meter socket assembly and two types of connectors, one type with a bypass horn for attachment to the lugs to provide a socket assembly with a bypass feature and one without a bypass horn for attachment to the lugs to provide a socket assembly without a bypass feature.

In general, this invention relates to a socket assembly for mounting an electric meter. The socket assembly comprises a plurality of power line connector subassemblies for connecting electric power lines to the socket assembly. Each subassembly comprises a generally U-shaped lug of electrically conductive material, a connector and a screw of electrically conductive material. The lug has opposing legs and a bottom defining a saddle for supporting one of the electric power lines. The connector comprises a body of electrically conductive material. The body has an inner face, an outer face and opposite sides slidably engageable with respective legs of the lug to mount the body on the lug in a position in which the inner face of the body faces toward the bottom of the lug and the outer face of the body faces away from the bottom of the lug. A horn of electrically conductive material projects from the body for connection to a bypass conductor forming at least part of an electrical path for bypassing the electric meter. A screw opening through the body extends from the outer face of the body to the inner face of the body. A screw is threadable through the screw opening to a position in which the screw is adapted to contact the power line in the saddle of the lug.

Another aspect of this invention relates to a bypass connector for use in a meter socket assembly in a meter box. The bypass connector comprises a body of electrically conductive material, a horn of electrically conductive material, and a screw opening through the body. The body has an inner face, an outer face and opposite sides adapted for slidably engaging respective legs of a generally U-shaped lug of the meter socket assembly to mount the connector on the lug in a position in which the inner face of the connector faces toward a bottom of the lug and the outer face of the connector faces away from the bottom of the lug. A horn projects from the body for connection to a bypass conductor forming at least part of an electrical path for bypassing an electric meter. The screw opening through the body extends from the outer face of the body to the inner face of the body. A screw is threadable through the screw opening to a position in which the screw is adapted to contact a power line positioned in the lug adjacent the bottom of the lug.

In yet another aspect, this invention relates to an electric meter socket assembly. The electric meter socket comprises a socket assembly and a connector system. The socket assembly mounts an electric meter and includes a plurality of power line connector subassemblies for connecting electric power lines to the socket assembly. Each subassembly comprises a generally U-shaped lug of electrically conductive material having opposing legs and a bottom defining a saddle for supporting one of the electric power lines. The connector system comprises a plurality of first bypass connectors, a plurality of second non-bypass connectors and screws of electrically conductive material. Each connector of the plurality of first bypass connectors comprises a body of electrical conductive material having an inner face, an outer face and opposite sides adapted to be slidably engaged with the legs of a respective lug to mount the body on the lug in a position in which the inner face of the body faces toward the bottom of the lug and the outer face of the body faces away from the bottom of the lug. A horn of electrically conductive material projects from the body for connection to a bypass conductor. A screw opening extends through the body from the outer face of the body to the inner face of the body. Each connector of the plurality of second non-bypass connectors comprises a body of electrically conductive material formed without a horn and having an inner face, an outer face and opposite sides adapted to be slidably engaged with the legs of a respective lug to mount the body on the lug in a position in which the inner face of the body faces toward the bottom of the lug and the outer face of the body faces away from the bottom of the lug. A screw opening extends through the body from the outer face of the body to the inner face of the body. The first and second connectors are selectively interchangeable with one another so that the socket assembly can be configured either to have the bypass system or not to have the bypass system. Screws are threadable through respective screw openings in the connectors to positions in which the screws are adapted to contact the power lines in the saddles of the lugs.

Other objects and features of the present invention will be in part apparent and in part pointed out hereinafter.

BRIEF DESCRIPTION OF THE DRAWINGS

Corresponding parts are designated by corresponding reference numbers throughout the drawings.

DETAILED DESCRIPTION

Figure 1:
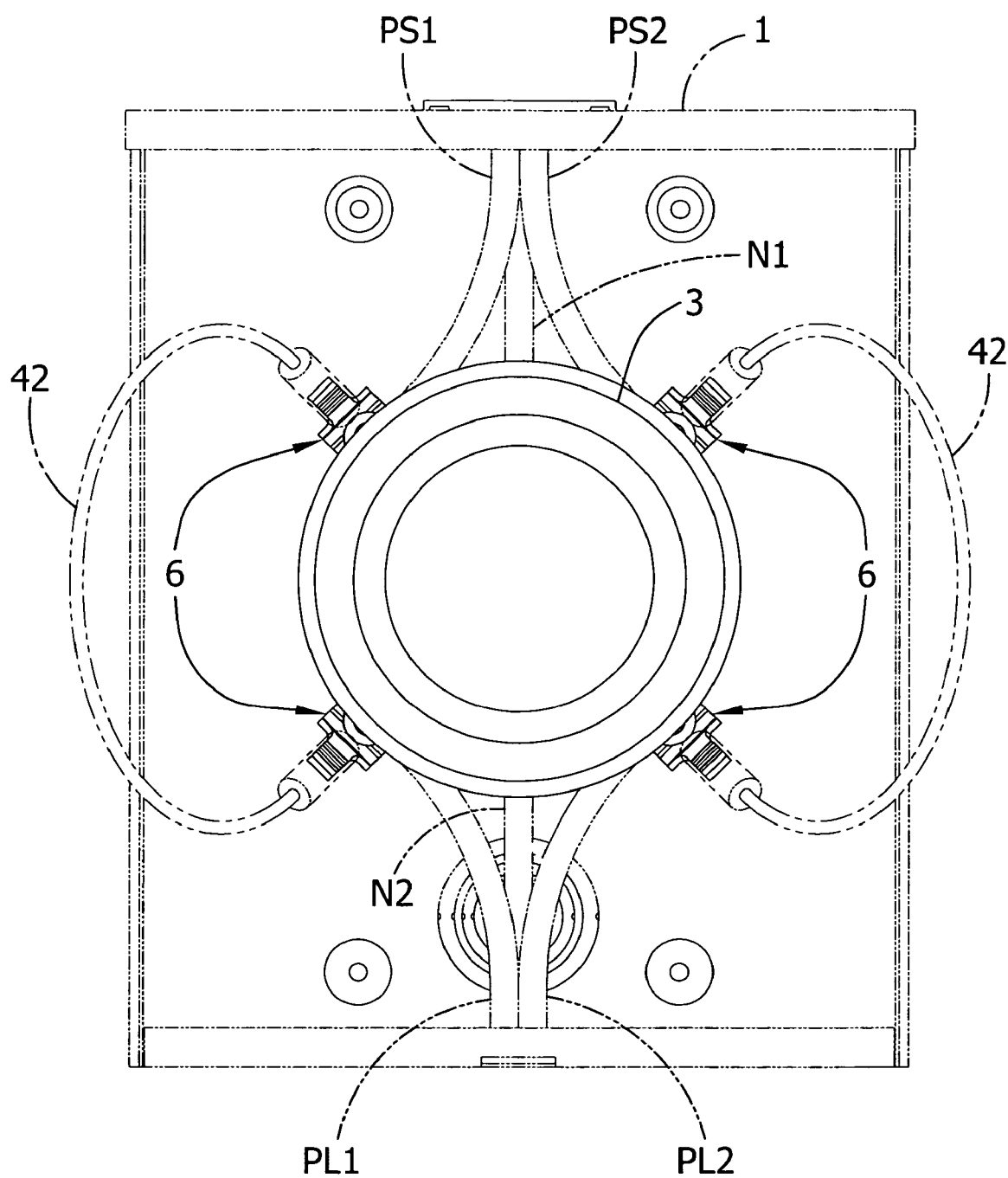
FIG. 1 is a plan view of a meter socket assembly of this invention mounting an electric meter in a meter box, the meter box and associated power lines being shown in phantom.
Figure 2:
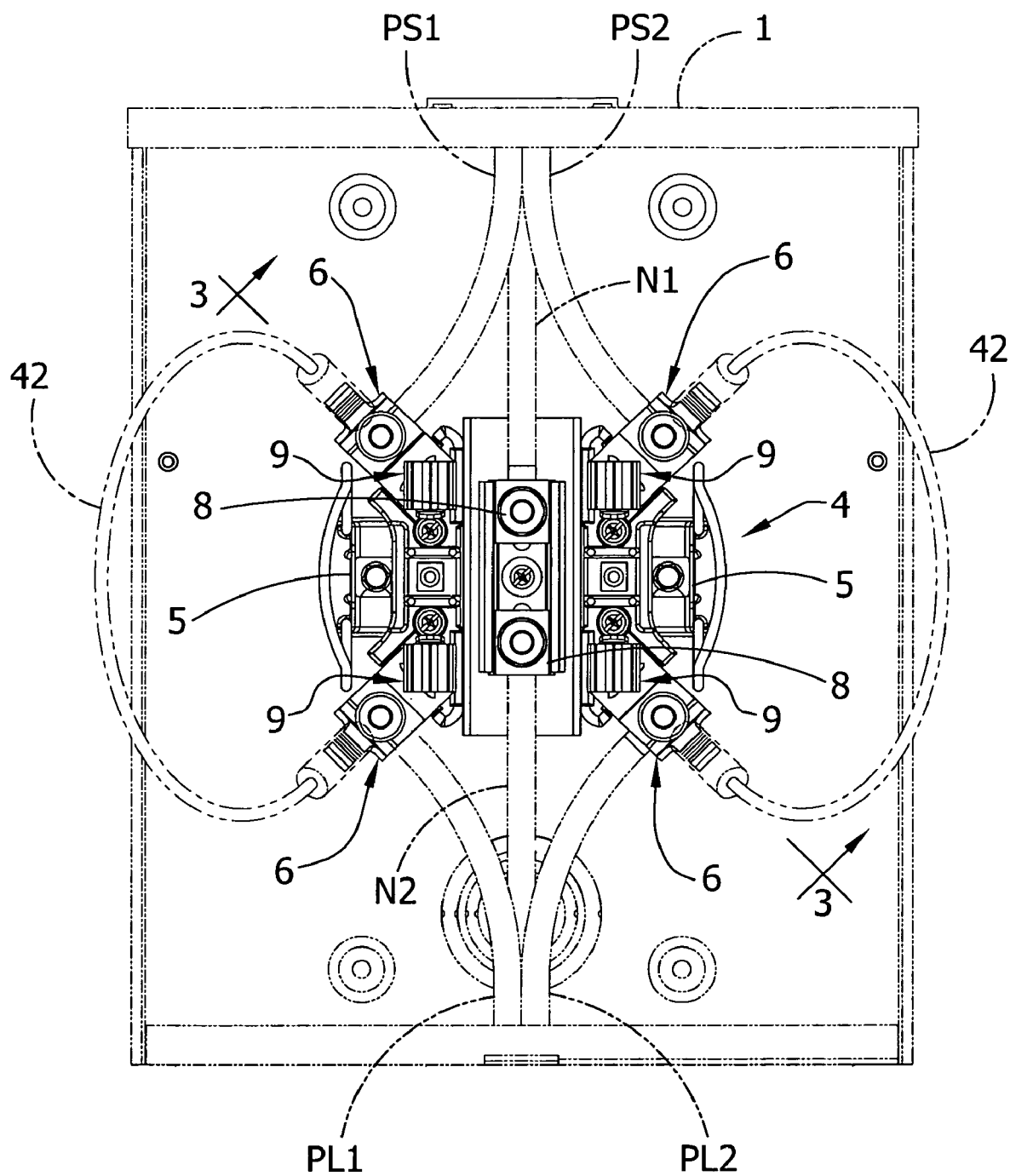
FIG. 2 is a view similar to FIG. 1 but with the electric meter removed from the socket assembly and bypass lines in position.

Referring now to the drawings, FIG. 1 shows an enclosure 1 (sometimes referred to as a meter box) for an electric meter 3. A meter socket assembly, generally designated 4, is mounted in the meter box 1 and comprises a support 5 bolted to the back wall of the box. The socket assembly 4 includes a plurality of power line connector subassemblies, generally designated 6, secured to the support 5 for connection to electric power conductors of a power line system. The particular installation shown in FIGS. 1 and 2 is a single-phase, 3-wire system comprising two power supply lines PS1, PS2 which transmit power from a suitable source of power and are connected to two corresponding connector subassemblies 6, two power load lines PL1, PL2 which transmit power to the facility being serviced and are connected to two corresponding connector subassemblies 6, and two neutral lines N1, N2 connected to neutral connectors 8 secured centrally of the support 5. A plurality of socket connectors 9 are also mounted on the support 5 for receiving mating connectors (not shown) of the electric meter 3.

Figure 3:
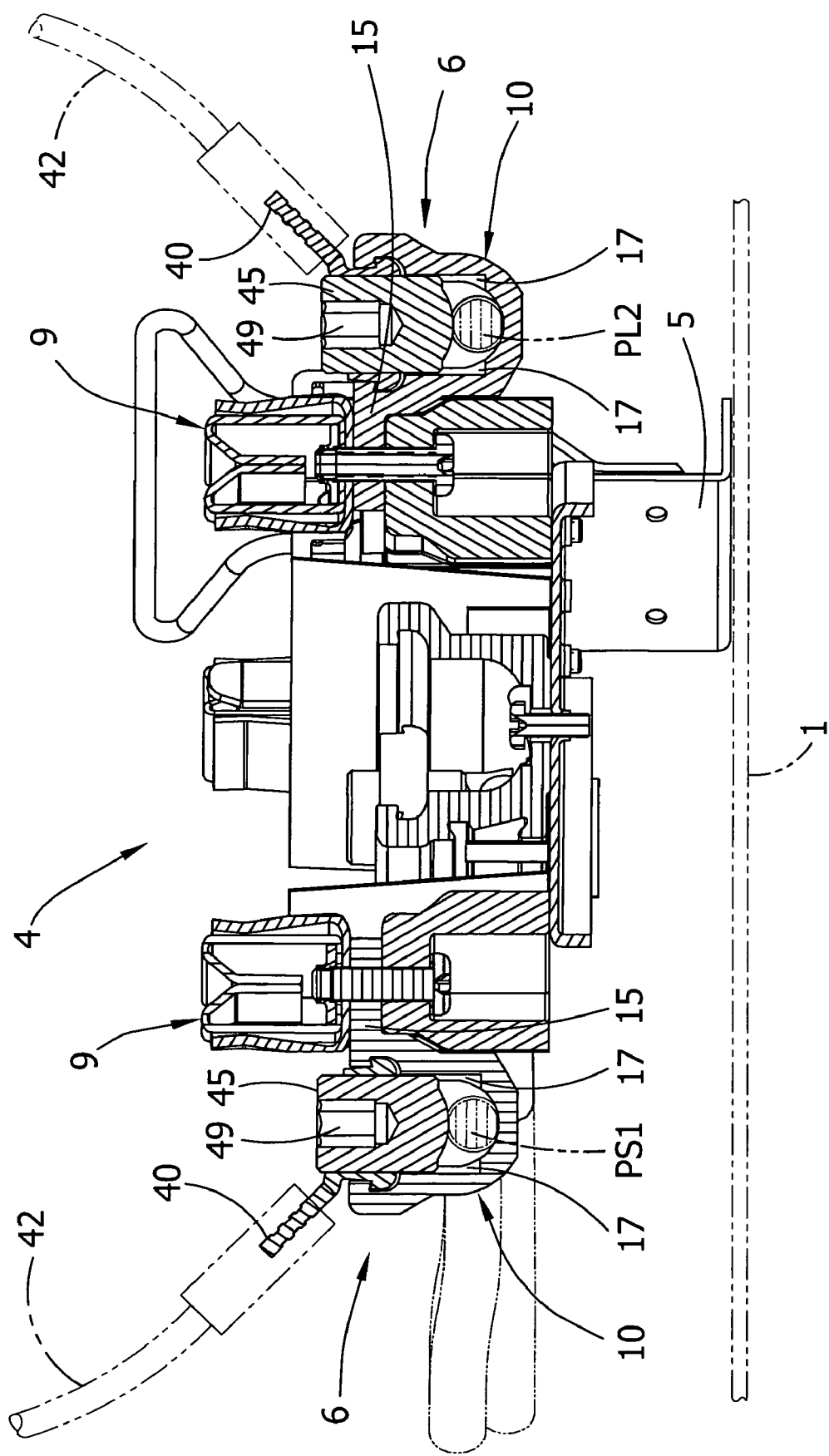
FIG. 3 is an enlarged section on lines 3—3 of FIG. 2.
Figure 4:
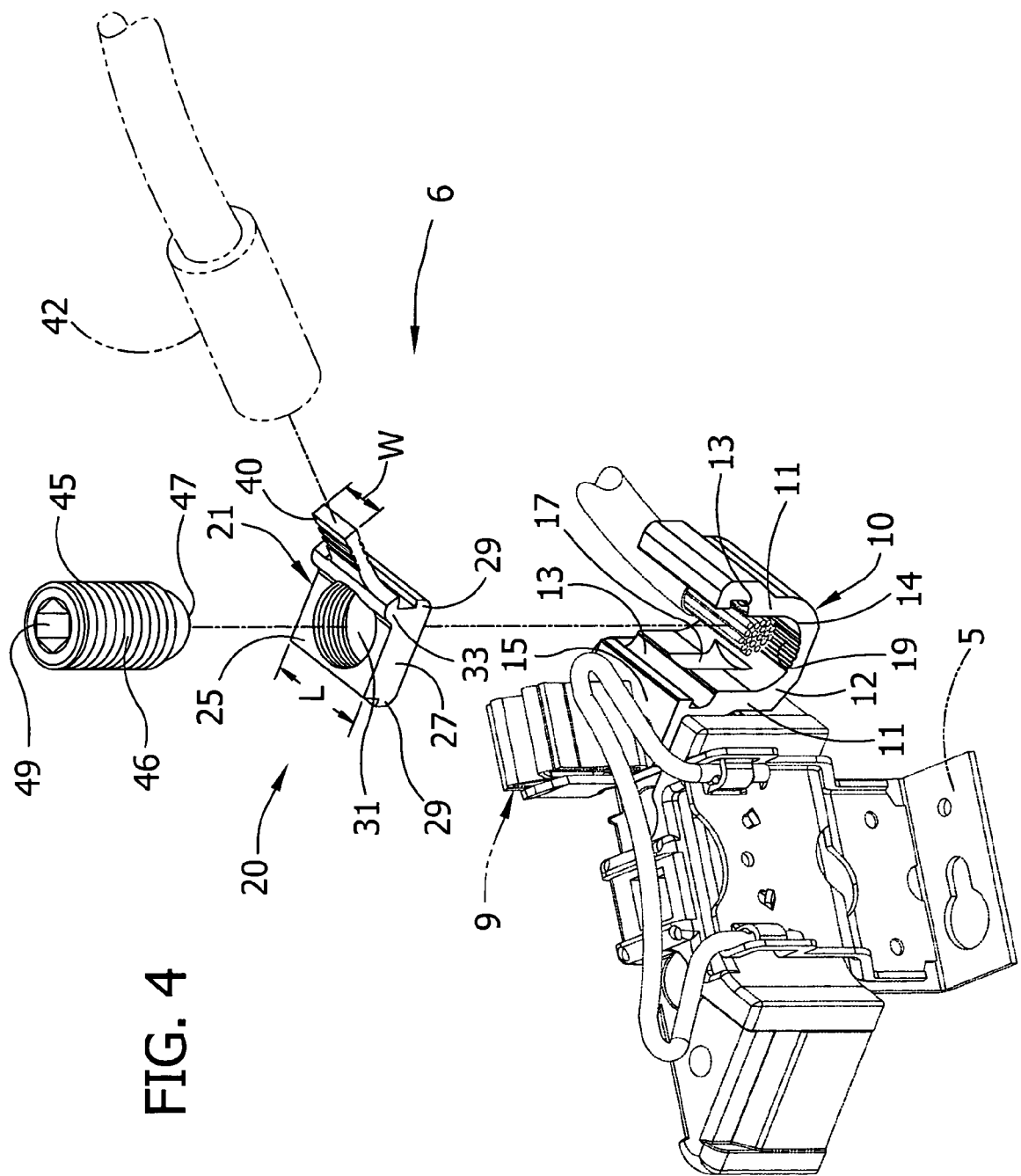
FIG. 4 is an exploded view of a connector assembly of the socket assembly.
Figure 5:
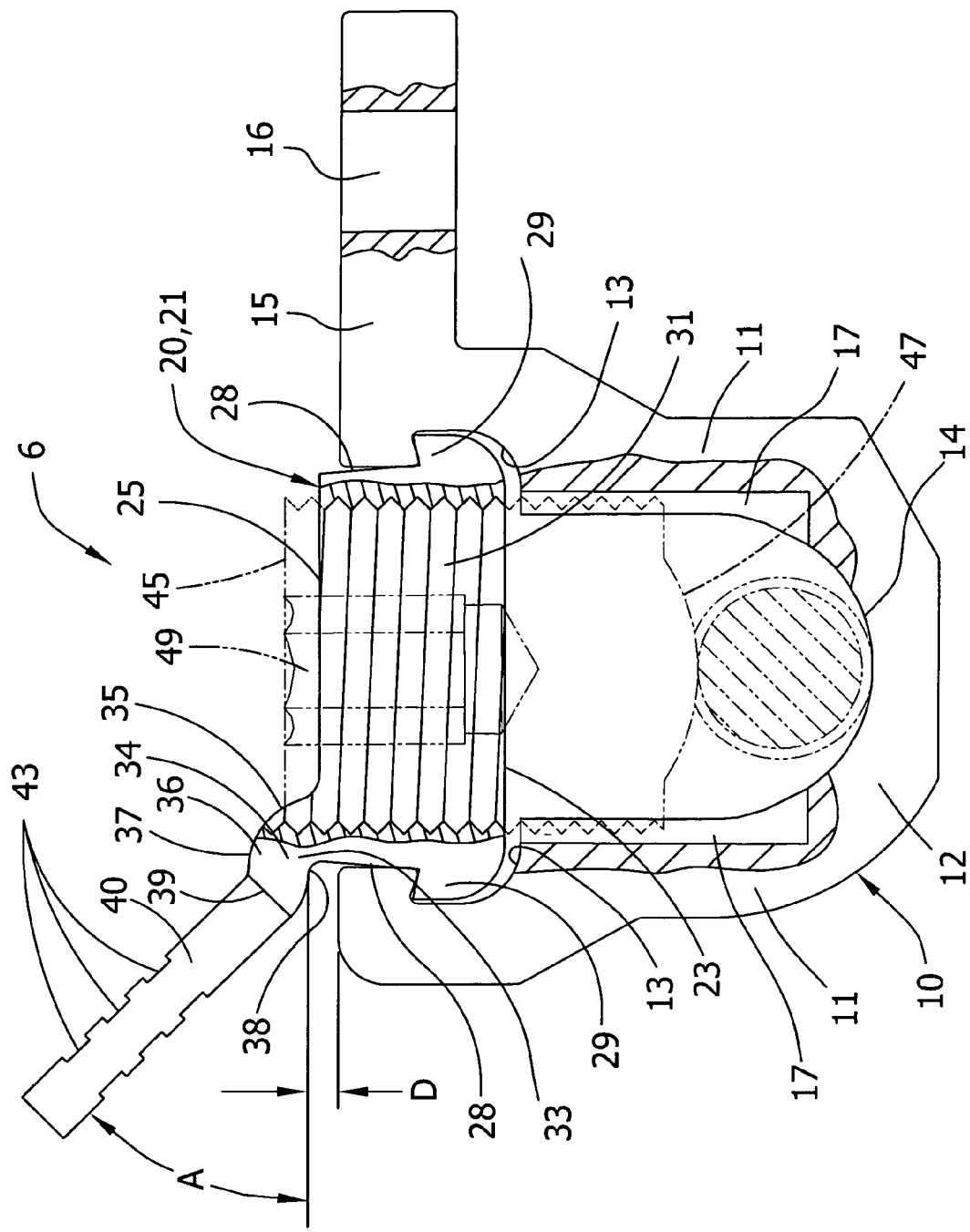
FIG. 5 is an end view of the connector assembly showing a first connector mounted on a lug.

As shown best in FIG. 3-5, each power line connector subassembly 6 includes a lug, generally designated 10, in the form of a channel having opposite ends. The lug 10 is generally U-shaped in cross section, having a pair of upstanding legs 11 and a bottom 12 which together define a saddle 14 for receiving a power conductor. In one embodiment, the opposing inside surfaces of the lug 10 are generally parallel and the bottom 12 is arcuate, but other configurations are contemplated. A pair of opposing grooves 13 extend along the inside surfaces of the legs 11 adjacent the upper (free) ends of the legs. A flange 15 formed as an integral part of the lug 10 extends laterally outward from one of the legs 11 adjacent the upper end of the leg. The flange 15 has a mounting hole 16 through it to enable mounting of the lug 10 on the socket assembly 4. The outer surface of the flange 15 may also be formed with registration elements (not shown) receivable in openings in the socket assembly 4 to maintain the lug 10 at the appropriate angular orientation relative to the assembly. The lug 10 may be extruded of suitable metal (e.g., aluminum) or it may be formed in other ways.

For reasons which will become apparent, the inside surfaces of the two legs 11 of the lug 10 have opposing recesses 17 therein which extend from respective grooves 13 toward the bottom 12 of the lug and, in one embodiment, terminate at about the juncture between the legs and the curved bottom of the lug. The bottom 12 of the lug 10 is formed with a series of parallel ridges 19 which may extend the length of the lug from one end to the other. These ridges 19 function to provide a good electrical connection between the lug 10 and a power conductor laid in the lug, as will appear.

Each power conductor subassembly 6 also includes a connector, generally designated 20, comprising a body, generally designated 21, of electrically conductive material (e.g., aluminum) having an inner face 23, an outer face 25, opposite ends 27 and opposite sides 28 adapted for sliding engagement with respective legs 11 of the lug 10 to mount the connector on the lug in a position in which the inner face 23 of the connector faces toward the bottom 12 of the lug and the outer face 25 of the connector faces away from the bottom of the lug, as shown in FIG. 5. In the embodiment shown, the body 21 of the connector 20 is approximately square, although other geometric shapes (e.g., rectangular) are contemplated. As shown, the body 21 has tongues 29 along its opposite sides 28 slidably receivable in the grooves 13 in respective legs 11 of the lug 10. The tongues 29 and grooves 13 preferably have a dovetail configuration, as shown in FIG. 5, but other shapes are possible. A threaded screw opening 31 extends through the body 21 from its outer face 25 to its inner face 23. By way of example, the screw opening 31 may be a ¾ in. diameter opening tapped with 16 UNF-2B threads.

Figure 6:
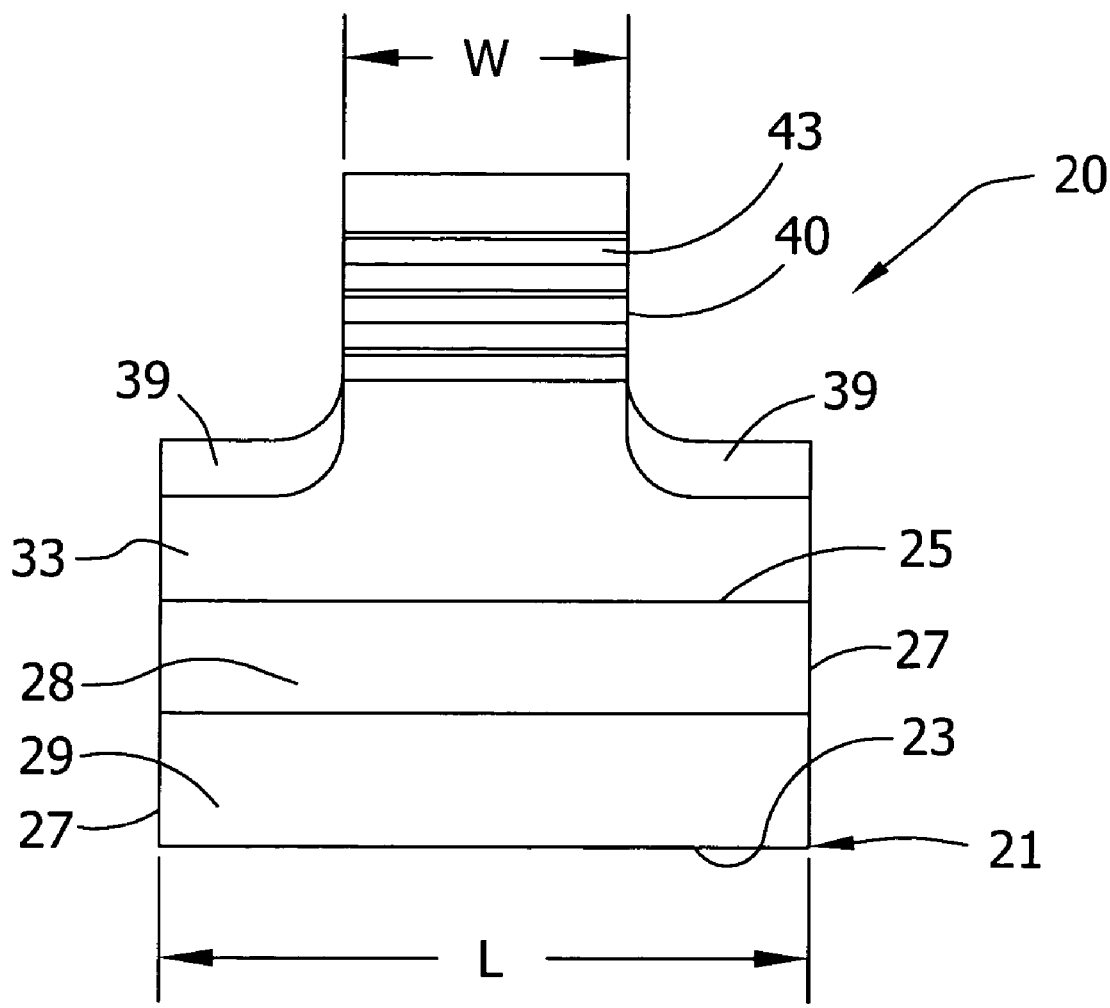
FIG. 6. is a side elevation of the first connector of FIG. 5.

The body 21 is preferably formed with a lateral extension 33 at one of its sides 28. In the embodiment illustrated in FIG. 5, the extension 33 has an inner part 34 with an outer surface 35 which curves up and away from the outer surface 25 of the body 21 and an outer part 36 having an outer surface 37 which extends generally parallel to the outer surface of the body as a cantilever laterally away from the body. When the connector 20 is mounted on the lug 10, the inner surface 38 of the inner part 34 is preferably spaced a distance D above the top edge of the underlying leg 11 of the lug. The extension 33 terminates in an outer edge 39 from which projects a bypass horn, designated 40. In one embodiment (see FIGS. 5 and 6), the horn 40 is generally rectangular, having a width W less than the length L of the body 21 and lateral extension 33, and the horn is centered along the length of the body and extension. Other horn shapes, sizes and locations are possible. A plurality of grooves 43 extend widthwise of the horn 40 to improve the connection between the horn and a suitable bypass connector 42 (e.g., wire with alligator clamps) of the bypass system. In the embodiment illustrated in FIGS. 1–6, the body 21, extension 33 and horn 40 are integrally formed as one piece (e.g., as an extruded part).

Referring to FIG. 5, the horn 40 of the illustrated embodiment is oriented at an oblique angle A relative to the outer face 25 of the body 21. While this angle A can vary without departing from the scope of this invention (e.g., from 0–270 degrees), this angle is preferably in the range of from about 0–90 degrees, more preferably in the range of from about 15–75 degrees, more preferably in the range of from about 30–60 degrees, still more preferably in the range of from about 40–50 degrees, and even more preferably about 45 degrees. The use of the lateral extension 33 enables the horn 40 to be positioned relatively far away from the screw opening 31 to facilitate manipulation of the screw, as needed. It will be understood that in other embodiments, the horn 40 can be attached directly to the body 21 (i.e, eliminating the lateral extension 33) and that the horn can be attached at other locations relative to the body.

The connector 20 further comprises a screw which, in one embodiment (FIG. 4), comprises a headless screw 45 having a threaded shank 46 which is rounded at one end 47 for contact with a power conductor in the saddle 14 of the lug 10. The opposite end has an opening 49 for receiving a suitable tool (e.g., Allen wrench) used to tighten the screw 45. Other types of screws can be used. The screw 45 is sized so that when the screw is threaded through the opening 31 in the body 21, opposite side portions of the shank 46 are received in the recesses 17 in the inside surfaces of the legs 11 of the lug 10. (For example, the screw may be a ¾ in. diameter screw.) As a result, the body 21 of the connector 20 is held in substantially fixed position lengthwise of the lug 10, thereby preventing the body from slipping out of the lug. The length L of the body 21 is desirably about the same as the length of the lug 10 so that when the ends of the body 27 are aligned with the ends of the lug, the screw opening 31 is substantially centered with respect to the recesses 17 in the legs 11 of the lug so that the screw 45 can be readily threaded into a position received in the recesses without substantial trial and error. The screw 45 is tightened to bring the rounded end 47 of the screw into pressure contact with a power conductor laid in the lug 10, thereby pressing the conductor into pressure contact with the ridges 19 in the saddle 14 of the lug to provide a good electrical connection between the conductor and the lug. The screw 45 may be of any suitable material, and it may either be electrically conductive or electrically non-conductive.

Figure 7:
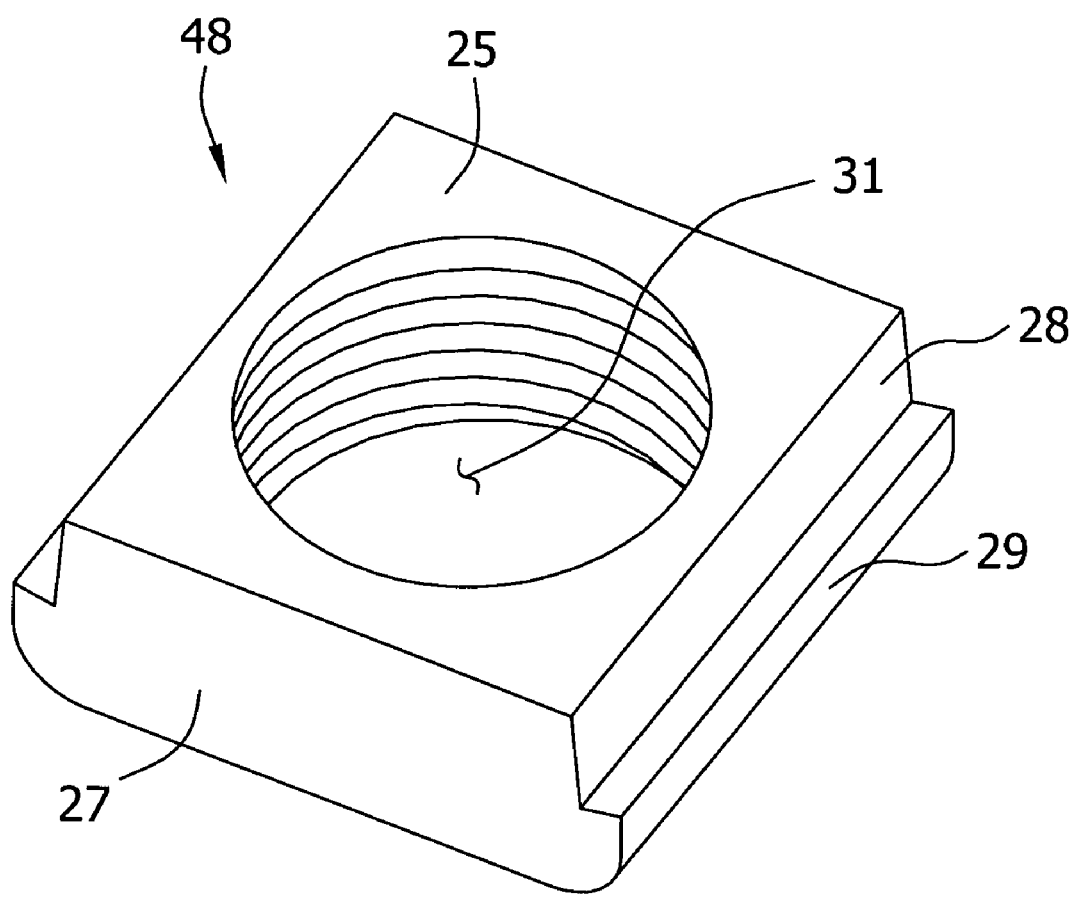
FIG. 7 is a perspective of a second connector.

In use, a plurality of the connectors 20 described above can be installed on the lugs 10 of the meter socket assembly 4 to provide a bypass system for bypassing the meter 3. Using this system, suitable bypass conductors 42 may be connected to the horns 40 of the connectors 20 in the manner shown in FIGS. 2 and 4, or in some other suitable fashion, to create an electrical path which bypasses the electric meter 3 so that the meter can be removed for repair, replacement, or other reasons without interrupting service to the facility using the electricity (e.g., a residence). In the event a bypass system is not required or desired, a second type of connector can be installed on the lugs 10. In one embodiment (FIG. 7), this second connector, generally designated 48, is substantially identical to the first connector 20 described above except that the second connector has no bypass horn 40 and preferably no lateral extension 33. Thus, a meter socket assembly 4 can be readily initially configured to include or not include the bypass system simply by selectively installing either the first connector 20 or second connector 48. Further, the meter socket 4 can be readily reconfigured either at the factory or in the field simply by replacing one connector with another. As a result, only one type of basic meter socket assembly 4, including lugs 10, needs to be made and stocked, thereby reducing cost. Also, this arrangement allows existing inventory configured (or reconfigured) quickly and easily to meet customer demand.

Figure 8:
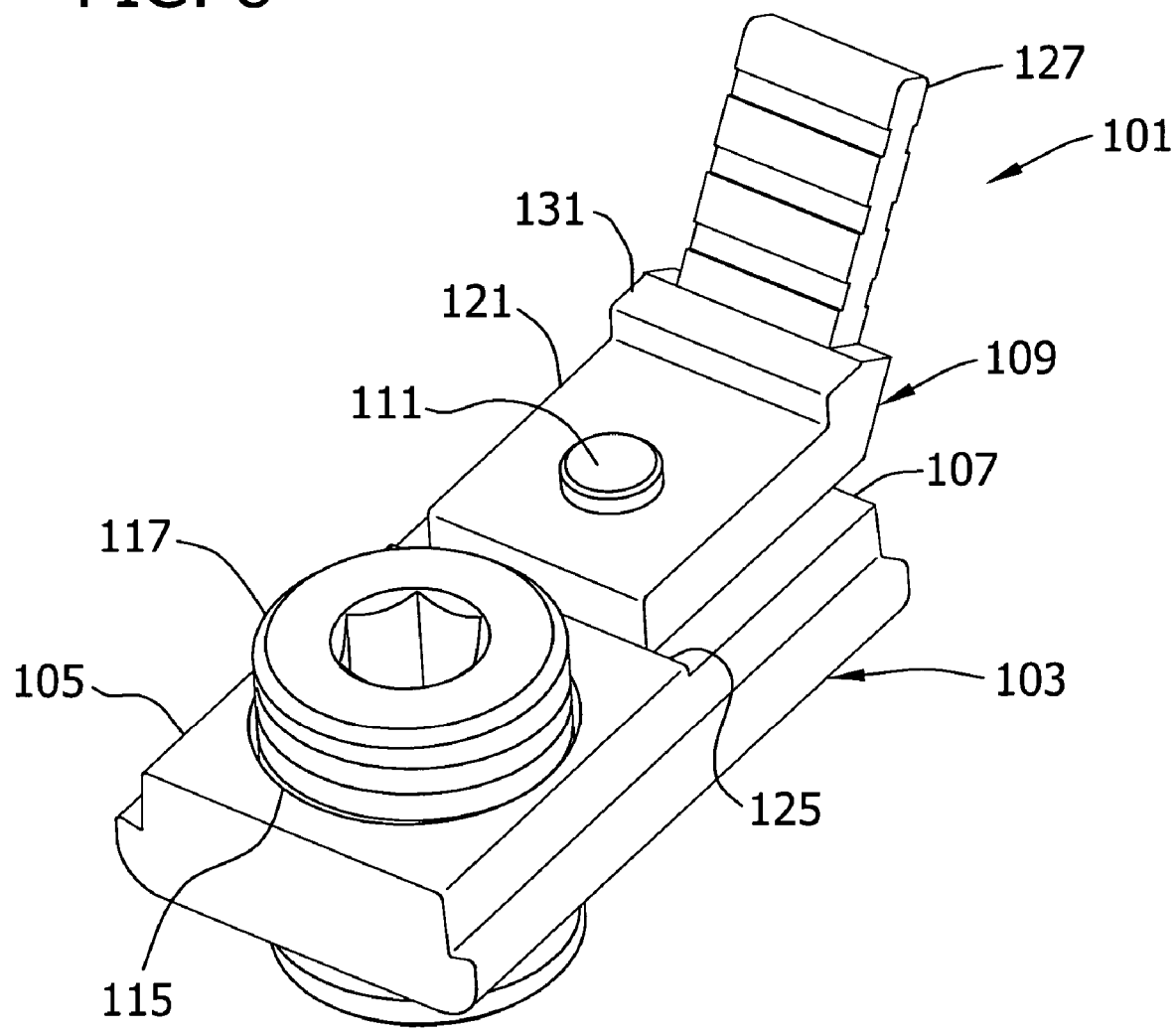
FIG. 8 is a perspective view of various parts of a third connector.
Figure 9:
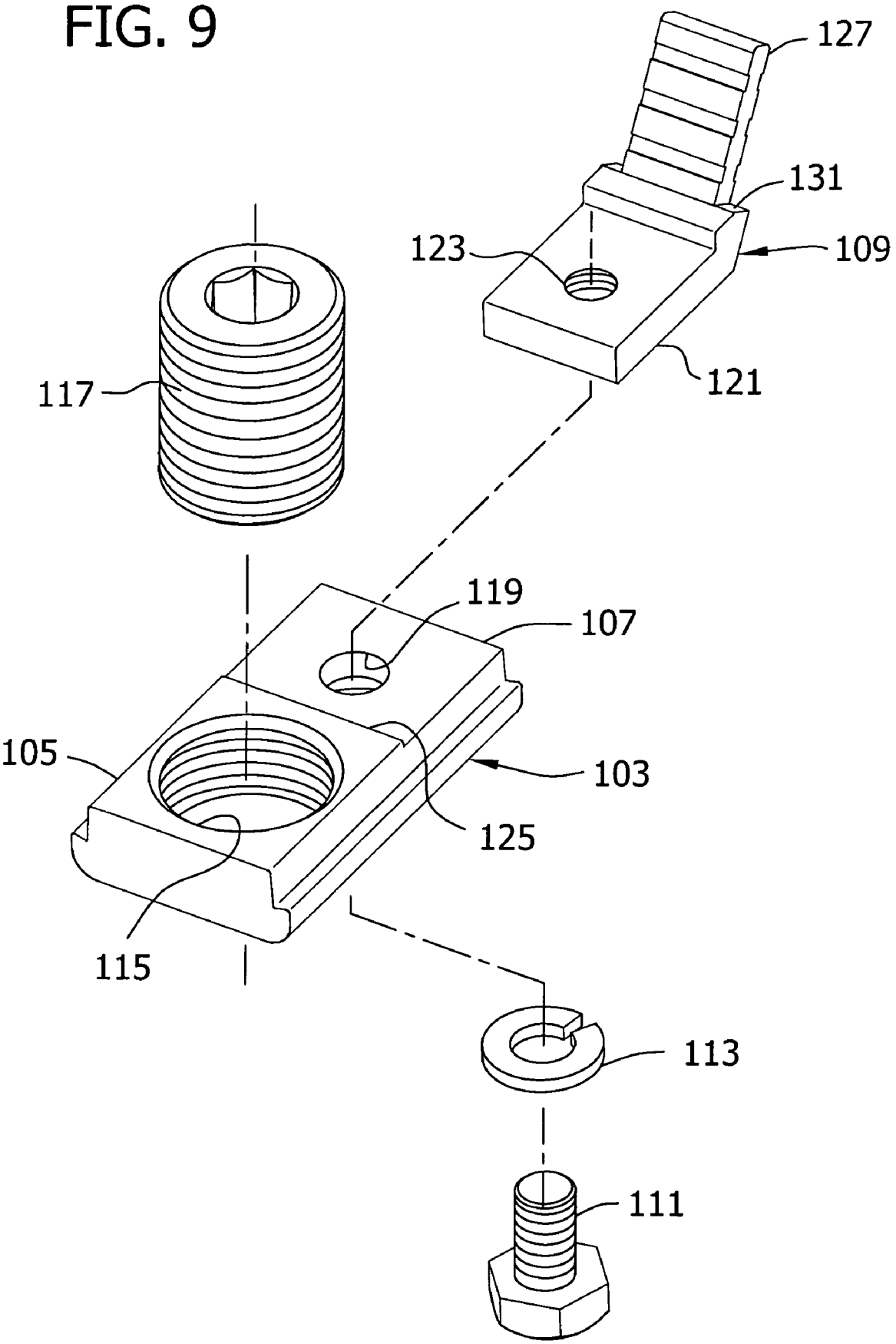
FIG. 9 is an exploded perspective view of the third connector.
Figure 10:
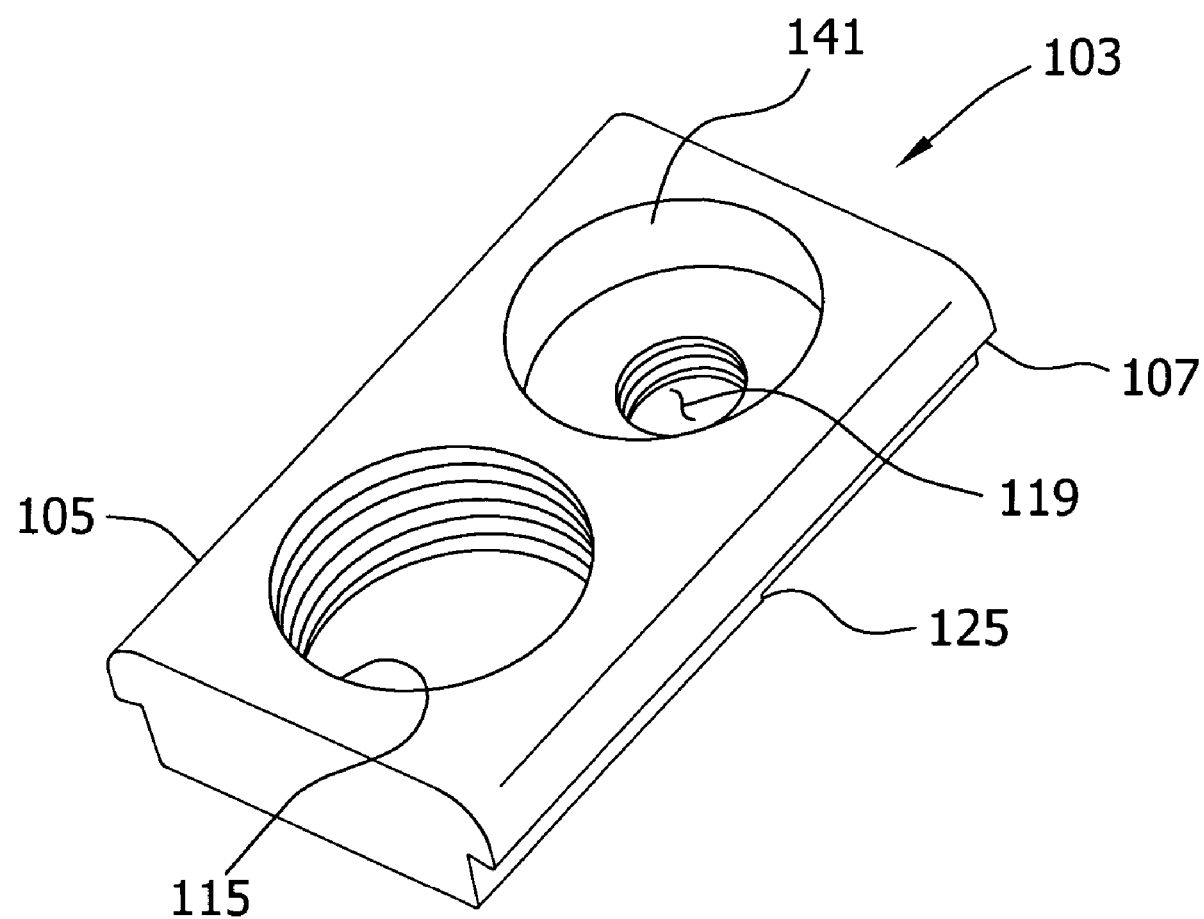
FIG. 10 is a bottom perspective of a body of the third connector.

While the bypass horn 40 illustrated in the drawings is integrally formed (e.g., extruded) as one piece with the body 21, it will be understood that the horn could be formed as a separate part and secured to the body. FIGS. 8–10 illustrate an exemplary connector of this type, generally designated 101, comprising a body 103 having generally the same cross sectional shape as the body 21 of the connector 20 of the first embodiment but having a greater length. In this particular embodiment, the body 103 has a first section 105 slidably engageable with a lug (not shown) similar to the the lug 10 previously described, and a second section 107 to which a separate bypass device 109 is secured, as by a suitable threaded fastener 111 and lock washer 113 (other fastening mechanisms may be used). The first section 105 of the connector body 103 is similar to the body 21 described above, having a hole 115 therein for receiving a screw 117 for pressing a conductor against the lug. The second section 107 of the connector body 103 has a threaded hole 119 in it for receiving the threaded fastener 111. The bypass device 109 has a body 121 with a hole 123 (e.g., a tapped hole) in it for receiving the fastener 111 to secure the device in a fixed position on the second section 107 of the body 103 of the connector. Preferably, the body 121 of the bypass device 109 is dimensioned so that it butts up against a shoulder 125 on the body 103 of the connector when the holes 119, 123 are aligned, thereby facilitating threading of the fastener 111 through the holes. The bypass device 109 also includes a bypass horn 127 (similar to the horn 40 described above) projecting from an extension 131 at one end of the body 121 of the bypass device. Other configurations for attaching the horn 127 to the connector are possible.

As shown in FIG. 10, the bottom face of the connector body 103 may be recessed as indicated at 141 for receiving a head of the fastener 111 and lock washer 113.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions without departing from the scope of the invention, it is intended that all matter contained in the above description and shown in the accompanying drawings shall be interpreted as illustrative and not in a limiting sense.

What is claimed is:

1. A socket assembly for mounting an electric meter, comprising
    a plurality of power line connector subassemblies for connecting electric power lines to the socket assembly, each subassembly comprising
        a generally U-shaped lug of electrically conductive material having opposing legs and a bottom defining a saddle for supporting one of said electric power lines,
        a connector comprising a body of electrically conductive material having an inner face, an outer face and opposite sides slidably engageable with respective legs of the lug to mount the body on the lug in a position in which the inner face of the body faces toward the bottom of the lug and the outer face of the body faces away from the bottom of the lug, a horn of electrically conductive material projecting from the body for connection to a bypass conductor forming at least part of an electrical path for bypassing said electric meter, and a screw opening through said body extending from the outer face of the body to the inner face of the body, and a screw threadable through said screw opening to a position in which the screw is adapted to contact said power line in the saddle of the lug.

2. A socket assembly as set forth in claim 1 wherein said horn projects laterally from the body at one side of the body.

3. A socket assembly as set forth in claim 2 wherein said body is formed with a lateral extension extending from said outer face of the body at said one side of the body and terminating in an outer edge, said horn extending from said outer edge away from the body.

4. A socket assembly as set forth in claim 3 wherein said horn extends at an oblique angle away from said outer face of the body.

5. A socket assembly as set forth in claim 1 wherein at least one leg of the lug has a recess therein for receiving a side portion of a shank of said screw when the screw is threaded through said screw opening.

6. A socket assembly as set forth in claim 5 wherein both legs of the lug have recesses therein for receiving opposing side portions of the screw shank when the screw is threaded through said screw opening.

7. A socket assembly as set forth in claim 5 wherein the body and the lug have about the same lengths to facilitate alignment of the screw opening in the body with said at least one screw-receiving recess in the leg of the lug.

8. A socket assembly as set forth in claim 1 wherein said lug is an elongate extruded metal part, and wherein said the legs of the lug have opposing inner surfaces formed with grooves extending lengthwise of the lug.

9. A socket assembly as set forth in claim 8 wherein said body is an elongate extruded metal part, and wherein the sides of the body have tongues slidably receivable in the grooves in the legs of the lug.

10. A socket assembly as set forth in claim 1 wherein said horn is formed integrally as one piece with the body of the connector.

11. A socket assembly as set forth in claim 1 wherein said body of the connector and said horn are formed as separate pieces secured together.

12. A bypass connector for use in a meter socket assembly in a meter box, said bypass connector comprising
a body of electrically conductive material having an inner face, an outer face and opposite sides adapted for slidably engaging respective legs of a generally U-shaped lug of said meter socket assembly to mount the connector on the lug in a position in which the inner face of the connector faces toward a bottom of the lug and the outer face of the connector faces away from the bottom of the lug,
a horn of electrically conductive material projecting from the body for connection to a bypass conductor forming at least part of an electrical path for bypassing an electric meter, and
a screw opening through said body extending from the outer face of the body to the inner face of the body for receiving a screw threadable through said screw opening to a position in which the screw is adapted to contact a power line positioned in the lug adjacent the bottom of the lug.

13. A connector as set forth in claim 12 wherein said horn projects laterally from the body at one side of the body.

14. A connector as set forth in claim 13 wherein said body is formed with a lateral extension extending from said outer face of the body at said one side of the body and terminating in an outer edge, said horn extending from said outer edge away from the body.

15. A connector as set forth in claim 12 wherein said horn extends at an oblique angle away from said outer face of the nut.

16. A socket assembly as set forth in claim 12 wherein said horn is formed integrally as one piece with the body of the connector.

17. A socket assembly as set forth in claim 12 wherein said body of the connector and said horn are formed as separate pieces secured together.

18. An electric meter socket assembly system, comprising
a socket assembly for mounting an electric meter, said socket assembly including a plurality of power line connector subassemblies for connecting electric power lines to the socket assembly, each subassembly comprising a generally U-shaped lug of electrically conductive material having opposing legs and a bottom defining a saddle for supporting one of said electric power lines, and
a connector system comprising
a plurality of first bypass connectors each comprising a body of electrically conductive material having an inner face, an outer face and opposite sides adapted to be slidably engaged with the legs of a respective lug to mount the body on the lug in a position in which the inner face of the body faces toward the bottom of the lug and the outer face of the body faces away from the bottom of the lug, a horn of electrically conductive material projecting from the body for connection to a bypass conductor forming at least part of an electrical bypass system for bypassing said electric meter, and a screw opening through said body extending from the outer face of the body to the inner face of the body, and
a plurality of second non-bypass connectors each comprising a body of electrically conductive material formed without a horn and having an inner face, an outer face and opposite sides adapted to be slidably engaged with the legs of a respective lug to mount the body on the lug in a position in which the inner face of the body faces toward the bottom of the lug and the outer face of the body faces away from the bottom of the lug, and a screw opening through said body extending from the outer face of the body to the inner face of the body,
said first and second connectors being selectively interchangeable with one another so that said socket assembly can be configured either to have said bypass system or not to have said bypass system, and
screws threadable through respective screw openings in said connectors to positions in which the screws are adapted to contact said power lines in the saddles of the lugs.

19. A system as set forth in claim 18 wherein said horn is formed integrally as one piece with the body of the first bypass connector.

20. A system as set forth in claim 18 wherein said body of the first bypass connector and said horn are formed as separate pieces secured together.

* * * * *